US012320003B2

(12) United States Patent
Nojiri

(10) Patent No.: US 12,320,003 B2
(45) Date of Patent: Jun. 3, 2025

(54) SUBSTRATE PROCESSING APPARATUS INCLUDING GAS DIFFUSION NOZZLE

(71) Applicant: ASM IP Holding B.V., Almere (NL)

(72) Inventor: Daiki Nojiri, Tama (JP)

(73) Assignee: ASM IP Holding B.V., Almere (NL)

( * ) Notice: Subject to any disclaimer, the term of this patent is extended or adjusted under 35 U.S.C. 154(b) by 95 days.

(21) Appl. No.: 18/200,218

(22) Filed: May 22, 2023

(65) Prior Publication Data

US 2023/0383410 A1 Nov. 30, 2023

Related U.S. Application Data

(60) Provisional application No. 63/345,773, filed on May 25, 2022.

(51) Int. Cl.
*C23C 16/513* (2006.01)
*C23C 16/455* (2006.01)
*C23C 16/458* (2006.01)

(52) U.S. Cl.
CPC ...... *C23C 16/513* (2013.01); *C23C 16/45559* (2013.01); *C23C 16/458* (2013.01)

(58) Field of Classification Search
CPC .................................................. C23C 16/513
See application file for complete search history.

(56) References Cited

U.S. PATENT DOCUMENTS 10,683,571 B2   6/2020  Jdira
2015/0240359 A1*  8/2015  Jdira ................ H01L 21/67017
                                                        137/561 A

* cited by examiner

*Primary Examiner* — Robert A Vetere
(74) *Attorney, Agent, or Firm* — Snell & Wilmer L.L.P.

(57) ABSTRACT

A substrate processing apparatus unit is disclosed. Exemplary substrate processing apparatus includes a reaction chamber; a susceptor disposed in the reaction chamber and configured to support a substrate; a shower plate provided above the susceptor; a gas transport tube positioned above the shower plate and in fluid communication with the reaction chamber; and a gas supply tube connected to the gas transport tube through a gas diffusion nozzle, wherein the gas diffusion nozzle comprises a plurality of holes, and wherein at least one of the holes is angled.

17 Claims, 4 Drawing Sheets

SUBSTRATE PROCESSING APPARATUS INCLUDING GAS DIFFUSION NOZZLE

CROSS-REFERENCE TO RELATED APPLICATIONS

This application claims priority to U.S. Provisional Patent Application Ser. No. 63/345,773 filed May 25, 2022 titled SUBSTRATE PROCESSING APPARATUS INCLUDING GAS DIFFUSION NOZZLE, the disclosure of which is hereby incorporated by reference in its entirety.

FIELD OF INVENTION

The present disclosure relates generally to a substrate processing apparatus including a gas diffusion nozzle.

BACKGROUND OF THE DISCLOSURE

In a process of manufacturing a semiconductor device, as a circuit line width decreases, more precise process control is required. In a film deposition process, various efforts to achieve high film uniformity have been made.

One major factor for uniform film deposition is a gas supply unit. A shower plate is a common gas supply unit. The shower plate has a merit of uniformly supplying a gas onto a substrate. However, the thickness of a film at an edge portion of the substrate and the thickness of a film at a center portion of the substrate may not be the same because, for example, gas is not mixed enough in a chamber.

Any discussion, including discussion of problems and solutions, set forth in this section, has been included in this disclosure solely for the purpose of providing a context for the present disclosure, and should not be taken as an admission that any or all of the discussion was known at the time the invention was made or otherwise constitutes prior art.

SUMMARY OF THE DISCLOSURE

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

In accordance with exemplary embodiments of the disclosure, a substrate processing apparatus is provided. The substrate processing apparatus comprises a reaction chamber; a susceptor disposed in the reaction chamber and configured to support a substrate; a shower plate provided above the susceptor; a gas transport tube positioned above the shower plate and in fluid communication with the reaction chamber; and a gas supply tube connected to the gas transport tube through a gas diffusion nozzle, wherein the gas diffusion nozzle comprises a plurality of holes, and wherein at least one of the holes is angled.

In various embodiments, the angle from the center axis of the hole may be between 10 to 45 degrees.

In various embodiments, the number of the holes may be between 4 to 8.

In various embodiments, the diameter of the hole may be between 2 to 5 mm.

In various embodiments, the substrate processing apparatus may further comprise a plurality of process gas lines and an inert gas line fluidly coupled to the gas supply tube.

In various embodiments, the substrate processing apparatus may further comprise a process gas source fluidly coupled to the process gas line.

In various embodiments, the substrate processing apparatus may further comprise an inert gas source fluidly coupled to the inert gas line.

In various embodiments, the process gas may be selected from at least one of: tetramethylsilane, trimethylsilane, ammonia, dinitrogen oxide, carbon dioxide, tetraethoxysilane, oxygen, or combination thereof.

In various embodiments, the inert may be selected from at least one of He, Ar, $N_2$, or combination thereof.

In various embodiments, the substrate processing apparatus may comprise plasma chemical vapor deposition apparatus.

BRIEF DESCRIPTION OF THE DRAWING FIGURES

A more complete understanding of exemplary embodiments of the present disclosure can be derived by referring to the detailed description and claims when considered in connection with the following illustrative figures.

It will be appreciated that elements in the figures are illustrated for simplicity and clarity and have not necessarily been drawn to scale. For example, the dimensions of some of the elements in the figures may be exaggerated relative to other elements to help understanding of illustrated embodiments of the present disclosure.

DETAILED DESCRIPTION OF EXEMPLARY EMBODIMENTS

Although certain embodiments and examples are disclosed below, it will be understood by those in the art that the disclosure extends beyond the specifically disclosed embodiments and/or uses of the disclosure and obvious modifications and equivalents thereof. Thus, it is intended that the scope of the disclosure should not be limited by the particular embodiments described herein.

The illustrations presented herein are not meant to be actual views of any particular material, apparatus, structure, or device, but are merely representations that are used to describe embodiments of the disclosure.

In this disclosure, "gas" may include material that is a gas at normal temperature and pressure, a vaporized solid and/or a vaporized liquid, and may be constituted by a single gas or a mixture of gases, depending on the context. A gas other than the process gas, i.e., a gas introduced without passing through a gas supply unit, such as a shower plate, or the like, may be used for, e.g., sealing the reaction space, and may include a seal gas, such as a rare or other inert gas. The term inert gas refers to a gas that does not take part in a chemical reaction to an appreciable extent and/or a gas that can excite a precursor when plasma power is applied.

As used herein, the term "substrate" may refer to any underlying material or materials that may be used, or upon which, a device, a circuit, or a film may be formed.

As used herein, the term "film" and "thin film" may refer to any continuous or non-continuous structures and material deposited by the methods disclosed herein. For example, "film" and "thin film" could include 2D materials, nanorods, nanotubes, or nanoparticles or even partial or full molecular layers or partial or full atomic layers or clusters of atoms and/or molecules. "Film" and "thin film" may comprise material or a layer with pinholes, but still be at least partially continuous.

Figure 1:
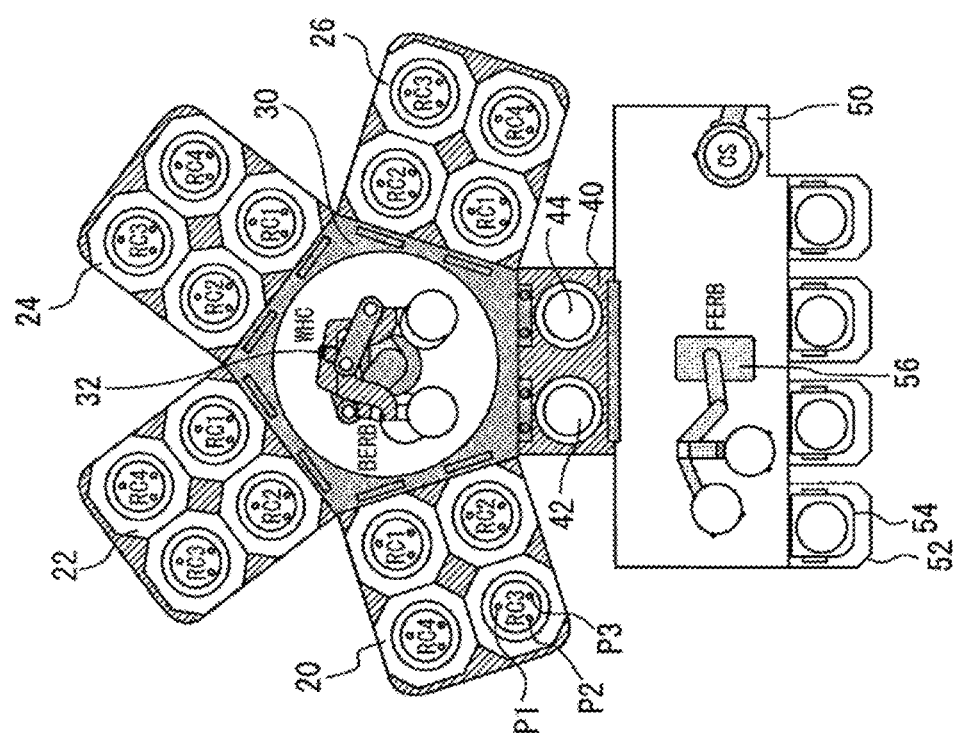
FIG. 1 is a schematic diagram of a substrate processing apparatus in an embodiment of the present invention.

FIG. 1 is a schematic plan view of a substrate processing apparatus in an embodiment of the present invention. The substrate processing apparatus may comprise: (i) four process modules 20, 22, 24, 26, each having four reaction chambers RC1, RC2, RC3, RC4; (ii) a substrate handling chamber 30 including two back end robots 32 (substrate handling robots); and (iii) a load lock chamber 40 for loading or unloading two substrates simultaneously, the load lock chamber 40 being attached to the one additional side of the substrate handling chamber 30, wherein each back end robot 32 is accessible to the load lock chamber 40. Each of the back end robots 32 have at least two end-effectors accessible to the two reaction chambers of each unit simultaneously, said substrate handling chamber 30 having a polygonal shape having four sides corresponding to and being attached to the four process modules 20, 22, 24, 26, respectively, and one additional side for a load lock chamber 40, all the sides being disposed on the same plane. The interior of each process modules 20, 22, 24, 26 and the interior of the load lock chamber 40 may be isolated from the interior of the substrate handling chamber 30 by a gate valve.

In some embodiments, a controller (not shown) may store software programmed to execute sequences of substrate transfer, for example. The controller may also: check the status of each process chamber; position substrates in each process chamber using sensing systems, control a gas box, and an electric box for each module; control a front-end robot 56 in an equipment front end module based on a distribution status of substrates stored in FOUP 52 and the load lock chamber 40; control the back-end robots 32; and the control gate valves and other valves.

A skilled artisan may appreciate that the apparatus includes one or more controller(s) programmed or otherwise configured to cause the deposition and reactor cleaning processes described elsewhere herein to be conducted. The controller(s) may communicate with the various power sources, heating systems, pumps, robotics, gas flow controllers, or valves, as will be appreciated by the skilled artisan.

In some embodiments, the apparatus may have any number of reaction chambers and process modules greater than one (e.g., 2, 3, 4, 5, 6, or 7). In FIG. 1, the apparatus has sixteen reaction chambers, but it may have 8 or more. Typically, the reaction chambers may comprise plasma reactors for depositing a thin film or layer on a wafer. In some embodiments, all the modules may have identical capabilities for treating wafers so that the unloading/loading can sequentially and regularly be timed, thereby increasing productivity or throughput. In some embodiments, the modules may have different capabilities (e.g., different treatments) but their handling times may be substantially identical.

Figure 2:
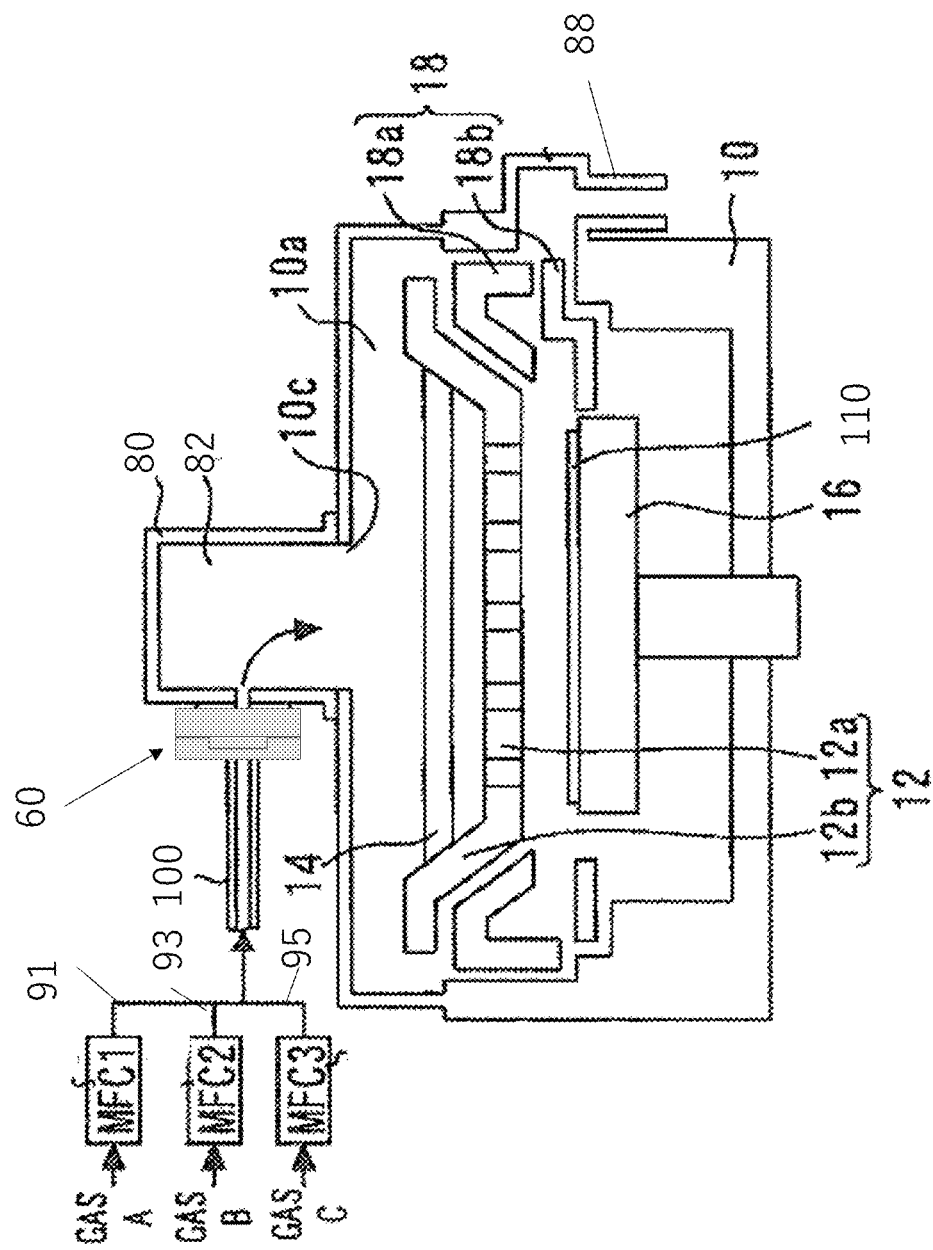
FIG. 2 is a schematic cross-sectional view of a substrate processing apparatus in an embodiment of the present invention.

FIG. 2 is a schematic cross-sectional view of a substrate processing apparatus in an embodiment of the present invention. The substrate processing apparatus includes a reaction chamber 10; a susceptor 16 disposed in the reaction chamber 10 and configured to support a substrate 110; a shower plate 12 provided above the susceptor 16; a gas transport tube 80 positioned above the shower plate 12 and in fluid communication with the reaction chamber 10; and a gas supply tube 100 connected to the gas transport tube 80 through a gas diffusion nozzle 60.

The shower plate 12 may comprise a face plate 12a, in which gas holes are formed, and a sidewall 12b. The shower plate 12 may be electrode for plasma enhanced chemical vapor deposition apparatus. The substrate processing apparatus may further include an intermediate plate 14 having holes.

The substrate processing apparatus may further include an exhaust channel 18 to exhaust gases to an exhaust port 88. The exhaust channel 18 may comprise an exhaust duct 18a and a flow control ring 18b. An exhaust pass may be formed between the exhaust duct 18a and the flow control ring 18b. The sidewall 12b may be placed on the exhaust duct 18b.

Figure 3:
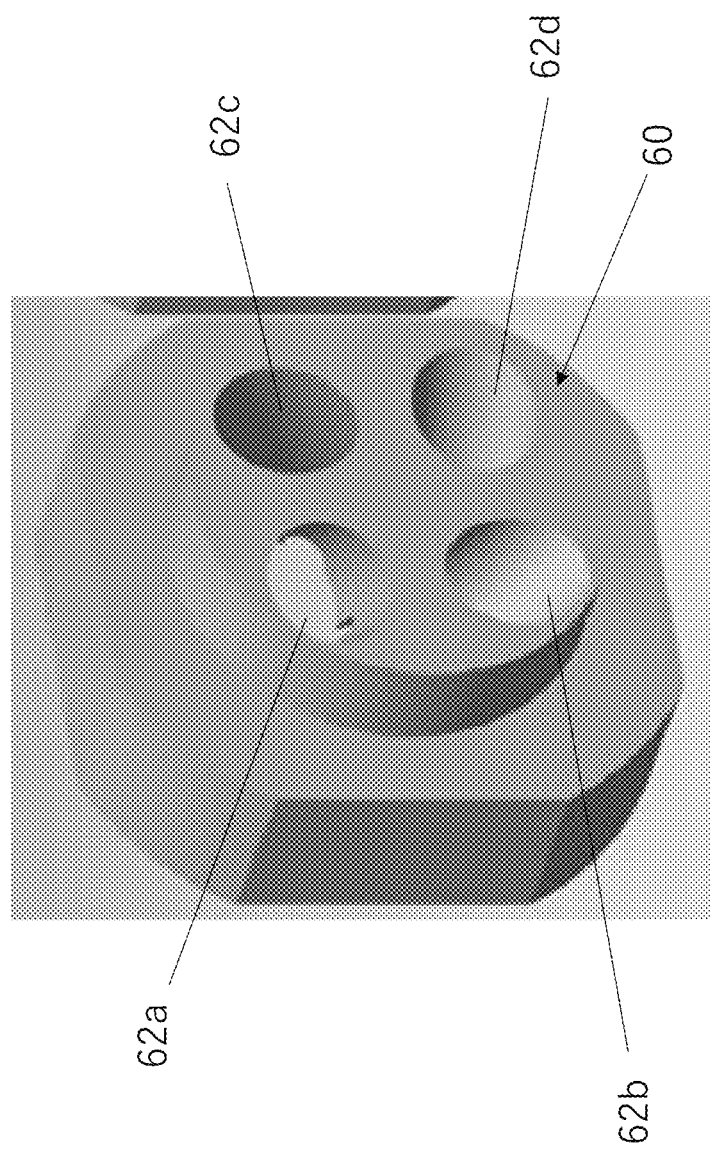
FIG. 3 is a schematic perspective view of a gas diffusion nozzle in an embodiment of the present invention.

FIG. 3 is a schematic perspective view of a gas diffusion nozzle in an embodiment of the present invention. The gas diffusion nozzle 60 includes a plurality of holes 62a, 62b, 62c, 62d. At least one of the holes is angled. The angle from the center axis of the hole may be between 10 to 45 degrees, preferably between 15-30 degrees. The number of the holes may be 4 to 8, preferably between 4 to 6. The diameter of the hole may be 2 to 5 mm, preferably between 2.5-4 mm.

As shown in FIG. 2, the substrate processing apparatus may further include a plurality of process gas lines 91, 93 and an inert gas line 95 fluidly coupled to the gas supply tube 100. A process gas sources A may be fluidly coupled to the process gas lines 91. In addition, a process gas sources B may be fluidly coupled to the process gas lines 93. Furthermore, an inert gas source C may be fluidly coupled to the inert gas line 95.

The process gas may be selected from at least one of tetramethylsilane, trimethylsilane, ammonia, dinitrogen oxide, carbon dioxide, tetraethoxysilane, oxygen, or combination thereof.

The inert may be selected from at least one of He, Ar, $N_2$, or combination thereof. The inert gas may be used to ignite a plasma or facilitate ignition of the plasma within the reaction chamber, to purge reactants and/or byproducts from the reaction chamber, and/or be used as a carrier gas to assist with delivery of the precursor to the reaction chamber.

Figures 4A, 4B:
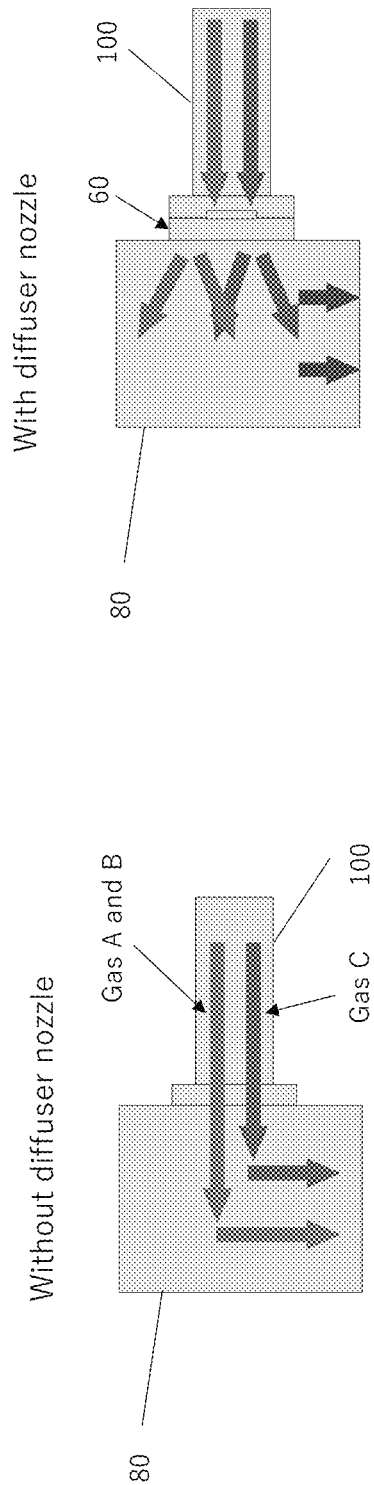
FIG. 4a is a schematic cross-sectional view of a gas diffusion nozzle in a comparative example.
FIG. 4b is a schematic cross-sectional view of a gas diffusion nozzle in an embodiment of the present invention.

FIG. 4a is a schematic cross-sectional view of a gas diffusion nozzle in a comparative example. Previously, the gas flows A, B are parallel to the gas flow C.

FIG. 4b is a schematic cross-sectional view of a gas diffusion nozzle in an embodiment of the present invention. The gas flows A, B are not parallel to the gas flow C since the holes 62a, 62b, 62c, 62d are angled. Therefore, the gases A, B, C are mixed enough before supplying into the reaction chamber 10 through the shower plate 12.

The example embodiments of the disclosure described above do not limit the scope of the invention, since these embodiments are merely examples of the embodiments of the invention. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

What is claimed is:

1. A substrate processing apparatus comprising:
   a reaction chamber;
   a susceptor disposed in the reaction chamber and configured to support a substrate;
   a shower plate provided above the susceptor;
   a gas transport tube positioned above the shower plate and in fluid communication with the reaction chamber; and
   a gas supply tube connected to the gas transport tube through a gas diffusion nozzle,
   wherein the gas diffusion nozzle comprises a body having a plurality of holes formed therethrough, the holes extending from a first exterior surface to an opposing second exterior surface, and
   wherein at least one of the holes is angled.

2. The substrate processing apparatus according to claim 1, wherein an angle of the at least one of the holes that is angled from the center axis of the hole is between 10 to 45 degrees.

3. The substrate processing apparatus according to claim 1, wherein a number of the plurality of holes is between 4 and 8.

4. The substrate processing apparatus according to claim 1, wherein a diameter of each of the plurality of holes is between 2 and 5 mm.

5. The substrate processing apparatus according to claim 1, further comprising a plurality of process gas lines and an inert gas line fluidly coupled to the gas supply tube.

6. The substrate processing apparatus according to claim 5, further comprising a process gas source fluidly comprising a process gas and coupled to a process gas line of the plurality of process gas lines.

7. The substrate processing apparatus according to claim 6, wherein the process gas is selected from at least one of: tetramethylsilane, trimethylsilane, ammonia, dinitrogen oxide, carbon dioxide, tetraethoxysilane, oxygen, or combination thereof.

8. The substrate processing apparatus according to claim 5, further comprising an inert gas source comprising an inert gas and fluidly coupled to the inert gas line.

9. The substrate processing apparatus according to claim 8, wherein the inert as is selected from at least one of He, Ar, $N_2$, or combination thereof.

10. The substrate processing apparatus according to claim 1, wherein the substrate processing apparatus comprises a plasma chemical vapor deposition apparatus.

11. The substrate processing apparatus according to claim 1, wherein the gas supply tube is coupled directly to the first exterior surface and the gas transport tube is coupled directly to the second exterior surface.

12. The substrate processing apparatus according to claim 1, wherein the gas diffusion nozzle is coupled to a sidewall of the gas transport tube.

13. The substrate processing apparatus according to claim 1, wherein a flow of gas within the gas supply tube is substantially perpendicular to a direction of flow of gas within the gas transport tube.

14. The substrate processing apparatus according to claim 1, wherein the first exterior surface comprises a protrusion, and wherein the holes are formed through the protrusion.

15. The substrate processing apparatus according to claim 1, comprising a plurality of process modules, wherein one of the plurality of process modules comprises the reaction chamber.

16. The substrate processing apparatus according to claim 1, wherein the showerhead comprises an intermediate plate comprising holes.

17. The substrate processing apparatus according to claim 1, wherein the gas diffusion nozzle is coupled directly to the gas transport tube.

* * * * *